United States Patent [19]
Macris

[11] Patent Number: 5,824,947
[45] Date of Patent: Oct. 20, 1998

[54] THERMOELECTRIC DEVICE

[76] Inventor: Chris Macris, P.O. Box 313, North Bend, Wash. 98045

[21] Appl. No.: 543,447

[22] Filed: Oct. 16, 1995

[51] Int. Cl.⁶ .................................................. A01L 35/00
[52] U.S. Cl. ........................ 136/200; 136/204; 136/211; 136/212; 136/225; 136/230; 136/237; 136/228
[58] Field of Search .................................. 136/200, 201, 136/203, 204, 205, 211, 212, 224, 225, 230, 237, 228; 419/8, 38; 62/3.2

[56] References Cited

U.S. PATENT DOCUMENTS

| | | | |
|---|---|---|---|
| 2,290,902 | 7/1942 | Wiegand | 136/5 |
| 2,997,514 | 8/1961 | Roeder, Jr. | 136/4 |
| 3,022,360 | 2/1962 | Pietsch | 136/4 |
| 3,051,767 | 8/1962 | Fredrick et al. | 136/5 |
| 3,070,644 | 12/1962 | van der Grinten et al. | 136/4 |
| 3,129,117 | 4/1964 | Harding, Jr. et al. | 136/5 |
| 3,182,391 | 5/1965 | Charland et al. | 29/420.5 |
| 3,201,504 | 8/1965 | Stevens | 264/104 |
| 3,287,473 | 11/1966 | Boyce, Jr. et al. | 264/25 |
| 3,303,058 | 2/1967 | Sonnenschein | 136/230 |
| 3,390,018 | 6/1968 | Habdas | 136/204 |
| 3,406,753 | 10/1968 | Habdas | 165/185 |
| 3,437,576 | 4/1969 | Nelson et al. | 204/192 |
| 3,496,028 | 2/1970 | Norton et al. | 136/211 |
| 3,510,362 | 5/1970 | Charland et al. | 136/202 |
| 3,546,025 | 12/1970 | Fredrick et al. | 136/205 |
| 3,547,705 | 12/1970 | Heard, Jr. | 136/203 |
| 3,547,706 | 12/1970 | McGrew | 136/205 |
| 3,601,887 | 8/1971 | Mitchell et al. | 29/573 |
| 3,707,429 | 12/1972 | Saunders | 161/116 |
| 3,794,527 | 2/1974 | Kim | 136/208 |
| 3,879,235 | 4/1975 | Gatos et al. | 148/171 |
| 3,943,553 | 3/1976 | Elfving et al. | 357/28 |
| 4,257,822 | 3/1981 | Gomez | 136/206 |
| 4,444,991 | 4/1984 | Beale | 136/225 |
| 4,467,611 | 8/1984 | Nelson et al. | 62/3 |
| 4,640,977 | 2/1987 | Shakun | 136/211 |
| 5,038,569 | 8/1991 | Shirota et al. | 62/3.2 |
| 5,064,476 | 11/1991 | Recine, Sr. | 136/201 |
| 5,419,780 | 5/1995 | Suski | 136/205 |
| 5,434,744 | 7/1995 | Fritz et al. | 361/704 |

FOREIGN PATENT DOCUMENTS

| | | | |
|---|---|---|---|
| 556685 | 6/1978 | Russian Federation | 62/3.2 |

OTHER PUBLICATIONS

Somers, E.V., "Energy Generation and Conversion", *Chemical Engineering*, May 10, 1965, pp. 167–174.

*Primary Examiner*—Bruce F. Bell
*Attorney, Agent, or Firm*—Jensen & Puntigam, P.S.

[57] ABSTRACT

A thermoelectric device fabricated of at least two dissimilar thermoelements and at least one of the thermoelements has a conductor in parallel therewith increasing the Figure of Merit. The thermoelements are also surrounded by a conductor along the leg lengths thereby simplifying the manufacturing process.

10 Claims, 6 Drawing Sheets

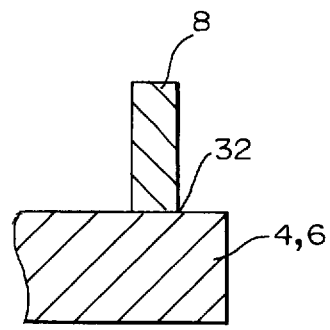
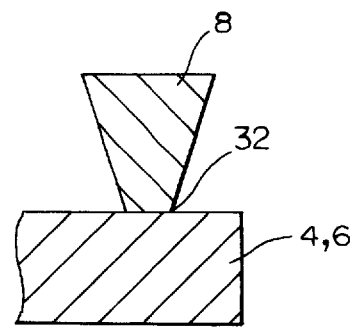
FIG. 5    FIG. 6
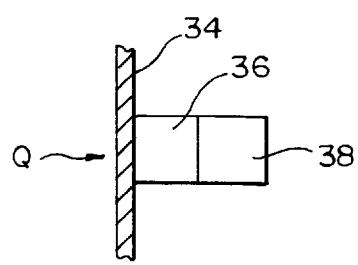
FIG. 7

THERMOELECTRIC DEVICE

TECHNICAL FIELD

This invention relates to thermoelectric compositions and structures and, more particularly, to a thermoelectric device wherein the device is fabricated of at least two dissimilar thermoelements, each of which is electrically connected to the other on its heat rejecting face by a heat rejecting interconnect of a distinct geometry, in that the contact point has a reduced cross sectional area from that of the individual thermoelement. In addition, the overall cross sectional area of this interconnect is increasing in cross sectional area as you move away from the thermoelement connection. This interconnect design increases thermal dissipation while minimizing the amount of thermoelement material required.

In at least one embodiment, a minimum of one conductor or semiconductor is electrically and thermally in parallel with the thermoelement. These additional conductors can be either external to the thermoelement, joined through their entire leg lengths or solely at their hot and cold junctions or, electrically parallel with the thermoelement internally such as in a matrix or mixture of conductor and thermoelement creating electrically micro-paralleled thermoelements.

In another embodiment of the present invention, the device comprises at least two dissimilar thermoelements, each of which is entirely encapsulated by the heat absorbing interconnection member on all surfaces with the exception of the face on which the heat rejecting interconnection member is attached. This heat absorbing interconnect, an electrically conductive member connecting the two dissimilar thermoelements at their heat absorbing faces, would also create a conductive shroud around each element which would decrease electrical resistance, allow for each thermoelement to be processed in place, and create a sturdy support as well as provide an inexpensive method of manufacture of devices.

BACKGROUND OF THE INVENTION

Conventional thermoelectric devices utilize dissimilar conductive materials subjected to a temperature gradient across their leg lengths to create an EMF or electro/motive force. This EMF is proportional to the intrinsic thermoelectric power of the thermoelements employed and the temperature differential between the hot and cold junctions. Alternatively, current may be introduced into the circuit to move heat, absorbing it at one junction, moving it and dissipating it at the other junction.

It is desirable that the thermoelements be of such a material that the highest EMF is developed for a given temperature differential between the hot and cold junctions. The electrical resistivity and thermal conductivity of the thermoelement in the device should be as low as possible in order to reduce both electrical and thermal losses and thus increase the efficiency.

It has been shown that when two or more electrical conductors and/or semiconductors are electrically in parallel with each other in a thermoelectric device circuit, then the Seebeck voltage, or EMF developed, will be the product of the conductive or semiconductive material with the leg length of least electrical resistance in the circuit. Additionally, the overall thermal conductivity and electrical resistivity of the entire circuit are derived by averaging the values of all materials utilized. The overall thermal conductivity and electrical resistivity values are necessary in order to calculate the Figure of Merit which, in turn, aids in determining the device's conversion efficiency. With a typical metal electrically in parallel with a semiconducting thermoelement having an overall electrical resistance of two or more times that of the semiconducting leg, the overall Figure of Merit of this device may be increased by fifteen to twenty percent.

One piece of prior art relevant to this concept is U.S. Pat. No. 4,257,822 granted to Gomez on Mar. 24, 1981, which discloses a thermopile having one continuous thermoelement and a second discontinuous thermoelement plated on the first, forming a repetitive set of thermocouples. In this configuration, one thermoelement is electrically parallel to the next with the absence of an actual conductor, other than a thermoelement, electrically parallel to each thermoelement.

Testing has also show that when an optimum heat dissipating interconnect is employed on the face of the thermoelement which is rejecting surplus heat, a direct correlation exists between the thermoelement's thermal conductivity and the optimum Any increase in leg length above this optimum would result in material waste.

A few prior art documents address this concept of unique heat rejecting interconnection members and their associated thermoelement interfaces.

U.S. Pat. No. 3,943,553 granted to Elfving on Mar. 9, 1976, discloses heat absorbing and heat dissipating interconnection members of multiple pieces including thin sheeted radiative or absorbent fins. Additionally, non-electrically conductive thermal conductors are thermally in parallel with each thermoelement.

U.S. Pat. No. 5,038,569 granted to Shirota on Aug. 13, 1991, claims a thermoelectric converter in which each thermoelement is sequentially stacked between each type of interconnection member which protrudes outward, parallel to the interface. The interconnection elongation occurs, not in the "Z" plane, but, in either the "X" or "Y" planes which yields a very large interconnect-thermoelement contact point cross sectional area.

U.S. Pat. No. 4,640,977 granted to Shakun on Feb. 3, 1987, discloses a thermoelectric device wherein the thermoelements sit atop "pedestal supports" which are, in fact, elongated in the "Z" plane. However, these "pedestals" still must be connected to interconnection members in order to join each pair of thermoelements together. Included in this document, is the optimization of the pedestal height, or the distance between the hot and cold interconnects.

Lastly, U.S. Pat. No. 4,444,991 granted to Beale on Apr. 24, 1984, presents a unique design in which interconnection members are eliminated by directly connecting the thermoelements. Also, these junctions are enlarged to provide more junction area to the heat source. The cross sectional area of every other junction is "considerably" larger than the others and of the thermoelement legs as well. Thus, the actual thermoelement junction depth is quite deep.

The unique design of heat rejecting interconnection members and their associated thermoelement interfaces, of the present invention, yield many significant advantages over the prior art: non-electrically conductive thermal conductors are eliminated which reduce heat losses; the thermoelement-interconnect contact point cross sectional area is equal to or less than the cross sectional area of the remaining portion of the interconnect in order to provide more heat carrying capacity; interconnection member geometry is optimized in all directions, including a dimensional variation throughout the entire length of the interconnect, in order to maximize heat transfer; lastly, infinitely small thermoelement junction depths are achieved, thus increasing efficiency by the reduction of the temperature drop across these junction depths. When a thermoelement is incorporated into the design of the present invention, that thermoelement's thermal conductivity value, in watts/centimeter per degree Celsius, in nearly the optimum thickness value given in centimeters, within some tolerances. For example, a Bismuth-Tellurium alloy thermoelement has a thermal conductivity value of 0.010 to 0.025 watts/centimeter per degree Celsius and it was found to have and optimum elemental thickness of approximately 5 to 10 mils. Other thermoelement materials were tested and all yielded the same result with some tolerances.

U.S. Pat. No. 5,434,744, granted to Fritz on Jul. 18, 1995 claims a substrated thermoelectric device in which thermoelement spacing is less than 0.010 inch and thermoelement thickness is less than 0.050 inch. In addition, an improved device is claimed to have greater than 300 thermoelements and their said thickness is "approximately" 0.020 inch. If the proper heat rejecting interconnection technology, identical to the present invention, is employed, and assuming the thermoelement materials utilized in the patent granted to Fritz have thermal conductivity values between 0.010 and 0.025 watts/cm per degree Celsius, the thermoelement thickness can be further reduced to the optimum range, thus eliminating waste.

It is also desirable to minimize the quantity of expensive thermoelectric material in addition to developing a thermoelectric device which is simple and inexpensive to manufacture.

DISCLOSURE TO THE INVENTION

Accordingly it is an object of the present invention to provide a thermoelectric device which has a superior efficiency for the temperature differential while minimizing the amount of expensive thermoelectric material.

Another object of the present invention is to provide a thermoelectric device which includes electrical conductors electrically parallel to each thermoelement which would increase the Figure of Merit of the entire device.

Another object of the present invention is to provide a heat rejecting interconnect of a configuration which maximizes the heat dissipation while serving as an efficient electrical conductor.

Yet another object of the present invention is to provide a thermoelectric device wherein each thermoelement is shielded or shrouded by a conductive material to be secured in place and also to decrease the overall electrical resistance of the device.

It is another object of the present invention to demonstrate a relationship between the optimum leg length, and its thermal conductivity when an optimum heat dissipating interconnect, such as the configuration presented in the present invention, is employed.

Yet another object of the present invention is to provided a thermoelectric device wherein the thermoelement are melted and/or grown form a granular or powder stock in their permanent locations in order to eliminate the need for separate molds and to create a deposit which is done offers the optimum morphology and yet is inexpensive to produce.

A still further object of the present invention is to provide a method of manufacture of a thermoelectric device which reduces the cost of the device, increases efficiency and results in a more robust device which is simpler to produce.

BRIEF DESCRIPTION OF THE DRAWINGS

FIGS. 5 and 6 are illustrations of interconnect configurations which are the most efficient movers of thermal energy.

FIG. 7 is a partial schematic showing one application of the present invention.

BEST MODE FOR CARRYING OUT THE INVENTION

Figure 1:
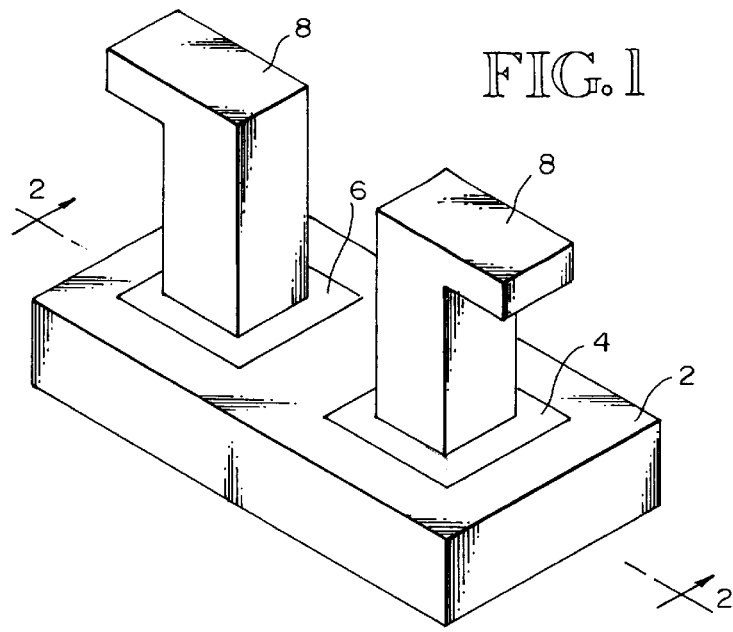
FIG. 1 is a pictorial representation, much enlarged, of illustrating the basic components of a thermoelectric couple in the present invention.

As seen in FIG. 1, the thermoelectric device includes a heat absorbing interconnection member 2 having embedded therein a positive type conductivity thermoelement 4 and a negative type conductivity thermoelement 6 thus creating a shrouding by the heat absorbing interconnect 2 on each thermoelememt 4 and 6. Upwardly extending from each of the thermoelements 4 and 6 is a heat rejecting interconnection members 8. To effectively transfer heat, the heat rejecting interconnect and the heat absorbing interconnect should be composed of a highly thermal and electrically conductive material such as copper and the thermoelements could be of a Bismuth-Tellurium, Bismuth-Selenium, Antimony-Tellurium alloy composition.

Figure 2:
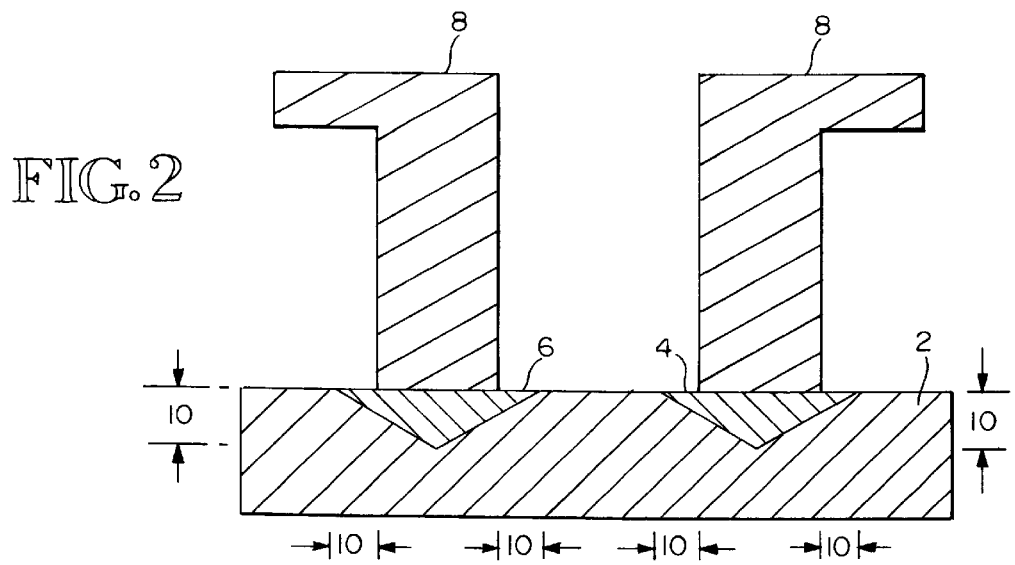
FIG. 2 is a vertical section on lines 2—2 of FIG. 1.

Reference is now had to FIG. 2 wherein it can be seen that the heat absorbing interconnect 2 has a cavity cut into one face and the thermoelements 4 and 6 are placed or formed in the cavity. Ideally, the distance from the heat rejecting interconnect 8 to the heat absorbing interconnect 2, traveling through the thermoelements 4 and 6, should be as close to equidistant (in all directions) as possible 10.

Figure 3:
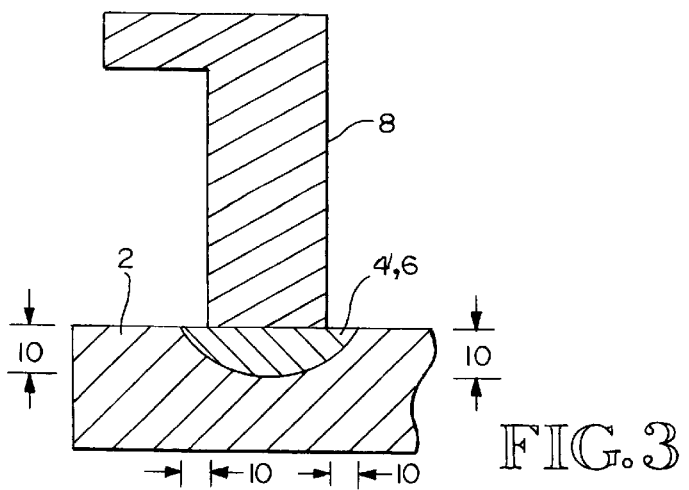
FIG. 3 is a vertical section displaying one half of a thermoelectric couple whole thermoelement is semispherical.

As seen in FIG. 3, a heat rejecting interconnect 8 is shown secured to the thermoelement 4, 6 embedded in a cavity in the heat absorbing interconnect 2. The thermoelement is semispherical in configuration and the vertical stem of the heat rejecting interconnect 68 has a cylindrical cross section, and although not shown exactly in the drawing, the distance between the outer edge of the heat rejecting interconnect 8 and the outer periphery of the thermoelement 4, 6 should be approximately equal to the distance from the bottom of the heat rejecting interconnect 8 to the heat absorbing interconnect 2 in all directions. To maximize this configuration, the vertical element of the heat rejecting interconnect 8 which mates with the surface of the thermoelement 4, 6 should be cylindrical. The thermoelement 4, 6 is in a semispherical cavity, thus assuring that the distance between the heat rejecting interconnect 8 to the heat absorbing interconnect 2 is approximately equal across the thermoelement 4, 6 in all directions.

As illustrated in FIGS. 1 through 3, the thermoelement cavities are formed in the heat absorbing interconnect and then the thermoelement materials, which may be in powder or granular form, are placed within their respective cavities and hot pressed in place or, in the alternative, the thermoelement could be flashed-melted or grown into a crystalline form from a molten state. An advantage of forming thermoelements in place is in the elimination of additional molding steps and the associated mold members which therefore generates fewer structural changes in the thermoelement itself, increases yield, allows for thinner thermoelements of optimum morphology and efficiency and decreases the overall cost of fabrication of the device.

Figure 4:
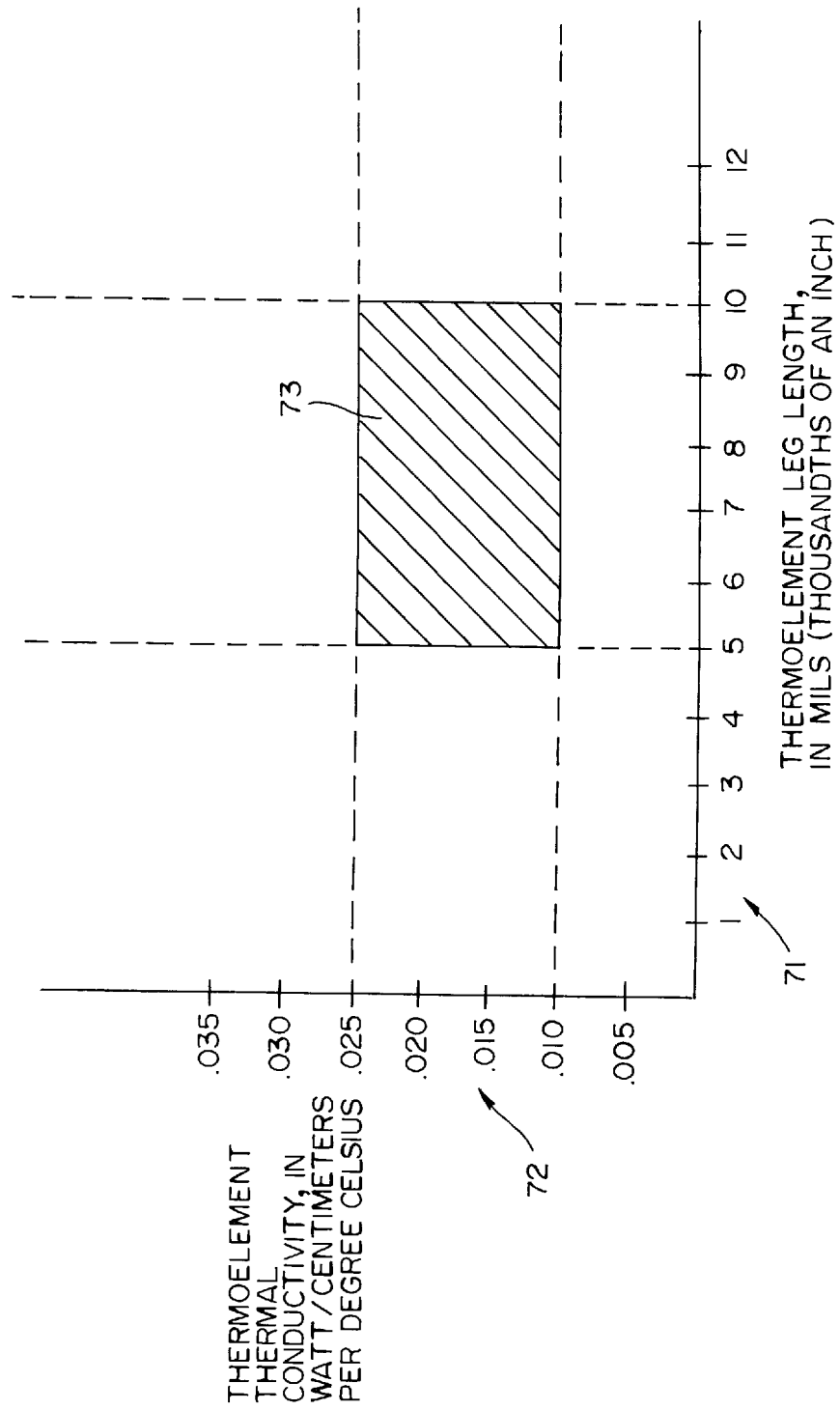
FIG. 4. graphically illustrates the optimum thermoelement leg length derived from each thermoelement's thermal conductivity.

FIG. 4 is a graphical illustration depicting the experimentally derived relationship between any thermoelement's leg length 71, and it's particular thermal conductivity value 72 yielding the optimum thermoelement leg length 73.

FIGS. 5 and 6 disclose two embodiments for the heat rejecting interconnect 8 wherein the portion of the heat rejecting interconnect 8, at the opposite end from the thermoelement 4, 6 is at least the same cross sectional area as it is at the contact point 32 yielding the most efficient heat rejecting interconnect 8.

FIG. 7 is a partial schematic showing an application of the present invention wherein the wall of a refrigerated area 34 has secured thereto a cooling thermoelectric device 36 whose hot end delivers thermal energy to the hot end of a power generating thermoelectric device 38. The wires and other interconnects are not shown for clarity.

Figure 8:
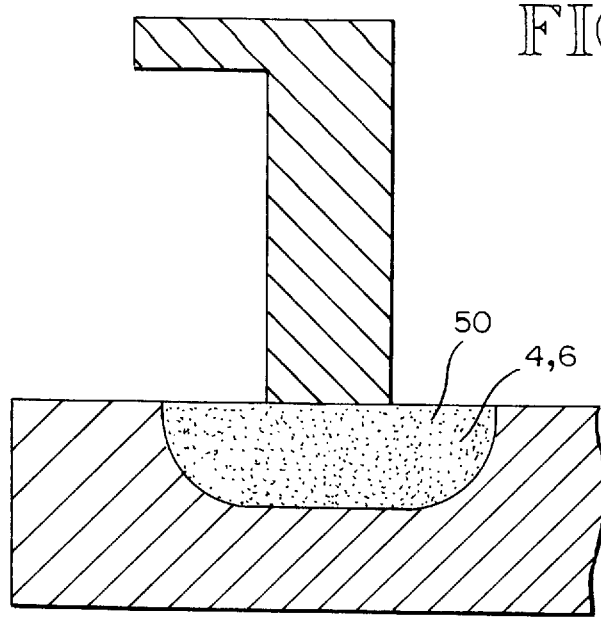
FIG. 8 is a sectional view similar to FIG. 3, including embedded electrically conductive particles electrically microparallel to the thermoelement material.

FIG. 8 depicts one half of a thermocouple similar to FIG. 3 which includes electrically micro-parallel conductive particles 50 embedded within the thermoelement 4, 6 which is molded in place, creating a mini electrically parallel system integral with the thermoelement.

Figure 9:
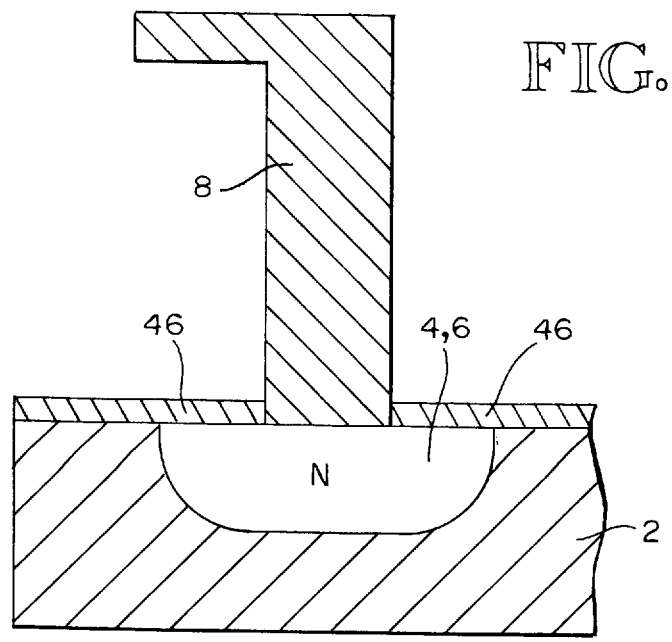
FIG. 9 is a sectional view similar to FIG. 3, wherein it includes electrically conducting material electrically in parallel with the thermoelement.
Figure 10:
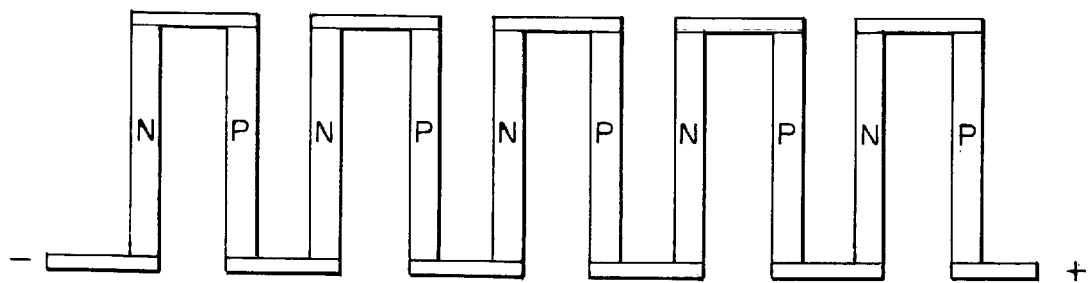
Figure 11:
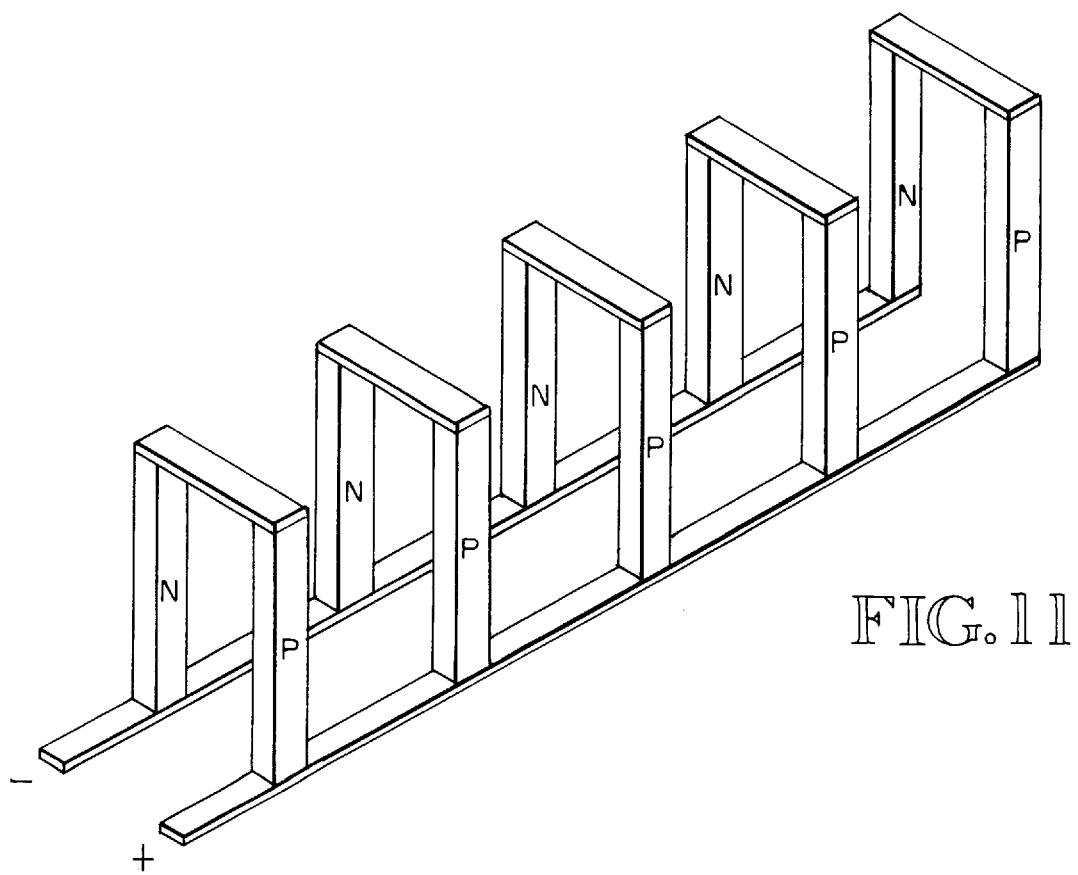
Figure 12:
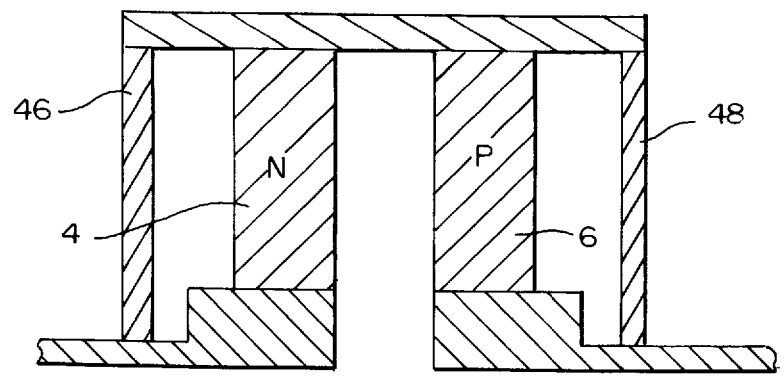
Figure 13:
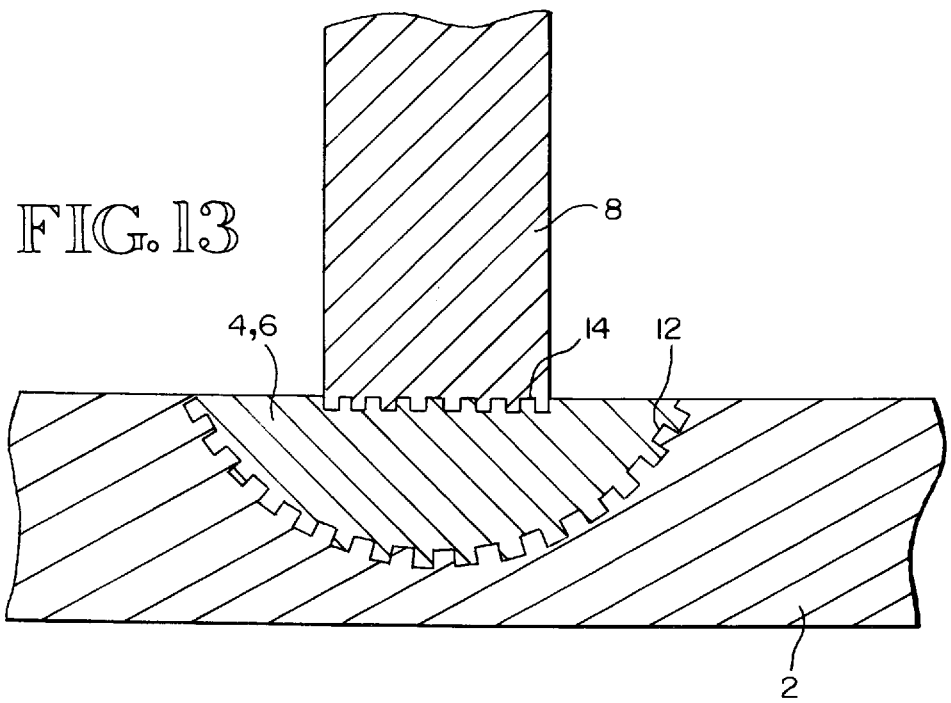

As seen in FIG. 9, the heat absorbing interconnect 2 has formed in place the thermoelement 4, 6 electrically connected to the heat rejecting interconnect 8 but further includes an electrically parallel member 46 covering the top portion of the thermoelement 4, 6.

Thus as can be seen, the present invention provides a method of manufacture of a sturdy, efficient thermoelement and resultant thermoelectric device.

I claim:

1. A thermoelectric device, including at least one heat absorbing interconnection member and at least one thermoelement, wherein the at least one heat absorbing interconnection member is of an electrically conductive material that encapsulates the at least one thermoelement on all of its surfaces with the exception of the face on which a heat rejecting interconnection member is attached.

2. A thermoelectric device, as in claim 1, which includes particulate thermoelectric material, comprising the step of:
a) hot pressing the particulate thermoelement material in place on the heat absorbing interconnection member.

3. A thermoelectric device, as in claim 1, including at least one thermoelement and one heat absorbing interconnection member, wherein the fabrication of each thermoelement, on the heat absorbing interconnection member, utilizes a flash melting or crystalline growth from a molten solution.

4. A thermoelectric device, including at least one heat rejecting interconnect, wherein heat rejecting faces of thermoelements have larger cross sectional areas than the cross sectional areas of the heat rejecting interconnects measured at junction points.

5. A thermoelectric device, as in claim 4, including at least one heat rejecting interconnect, wherein the heat rejecting interconnect has a cross sectional area greater than the cross sectional area of its junction with the thermoelement.

6. A thermoelectric device design including at least one thermoelement and at least one heat absorbing interconnection member which includes at least one semispherical cavity, wherein the semispherical cavity, containing the thermoelement, is partially encapsulated on one face of the heat absorbing interconnection member.

7. A thermoelectric device design including at least one heat rejecting interconnect, one heat absorbing interconnect and one thermoelement wherein the distance from the heat rejecting interconnect, at the point where it contacts the thermoelement, to the heat absorbing interconnect is substantially constant in all directions.

8. A thermoelectric device, including at least one thermoelement wherein each thermoelement has a leg length between 5 to 10 mils utilizing a thermoelement material whose thermal conductivity lies between 0.01 and 0.025 watts/centimeter per degree Celsius.

9. A thermoelectric device, including at least one thermoelement and including at least one electrical conductor or semiconductor, wherein each conductor or semiconductor is electrically in parallel with a thermoelement of dissimilar conductivity from that of the conductor or semiconductor and wherein an electrically parallel conductor or semiconductor is combined into a mixture with the thermoelement material.

10. A thermoelectric device, including at least one thermoelement with a leg length and including at least one electrical conductor or semiconductor, wherein each conductor or semiconductor is electrically in parallel with a thermoelement of dissimilar conductivity from that of the conductor or semiconductor wherein the conductor or semiconductor has a leg length; and wherein each conductor or semiconductor is electrically in parallel with a thermoelement of dissimilar conductivity from that of the conductor or semiconductor and wherein an electrically parallel conductor or semiconductor leg length has an internal electrical resistance value equal to or greater than two times that of the electrical resistance of the thermoelement leg length it electrically parallels.

* * * * *